United States Patent [19]
Hidese

[11] Patent Number: 5,208,975
[45] Date of Patent: May 11, 1993

[54] METHOD AND APPARATUS FOR MOUNTING ELECTRONIC PARTS

[75] Inventor: Wataru Hidese, Chikushino, Japan

[73] Assignee: Matsushita Electric Industrial Co., Ltd., Osaka, Japan

[21] Appl. No.: 918,063

[22] Filed: Jul. 24, 1992

Related U.S. Application Data

[63] Continuation-in-part of Ser. No. 723,915, Jul. 1, 1991, abandoned.

[30] Foreign Application Priority Data

Jul. 6, 1990 [JP] Japan .................................. 2-180047

[51] Int. Cl.⁵ ............................................ H05K 3/30
[52] U.S. Cl. ........................................ 29/832; 29/714; 29/740; 29/743
[58] Field of Search ................................ 29/832–841, 29/407, 709, 714, 719, 739, 740, 741, 743, 744, 759

[56] References Cited

U.S. PATENT DOCUMENTS

| | | | |
|---|---|---|---|
| 4,553,323 | 11/1985 | Clark | 29/714 X |
| 4,790,069 | 12/1988 | Maruyama et al. | 29/714 X |
| 4,825,538 | 5/1989 | Kubis | 29/739 X |
| 4,905,370 | 3/1990 | Hineno et al. | 29/740 |
| 4,979,286 | 12/1990 | Nakayama et al. | 29/740 |
| 5,033,185 | 7/1991 | Hidese | 29/740 |
| 5,070,598 | 12/1991 | Itagaki et al. | 29/714 X |
| 5,155,903 | 10/1992 | Nakashima et al. | 29/740 X |

*Primary Examiner*—Timothy V. Eley
*Attorney, Agent, or Firm*—Pollock, Vande Sande & Priddy

[57] ABSTRACT

An electronic parts mounting apparatus includes an index rotary member. The index rotary member is rotated. A plurality of mounted heads are provided on the index rotary member for sucking electronic components, and for mounting the electronic components on a printed circuit board. The mounting heads are vertically moved through a stoke relative to the printed circuit board. The stroke of movement of the mounting heads is adjusted. A vertically-movable table is provided on a horizontally-movable table. Clampers are supported on the vertically-movable table for holding the printed circuit board therebetween. The vertically-movable table is vertically moved to adjust a height of the printed circuit board held between the clampers.

3 Claims, 5 Drawing Sheets

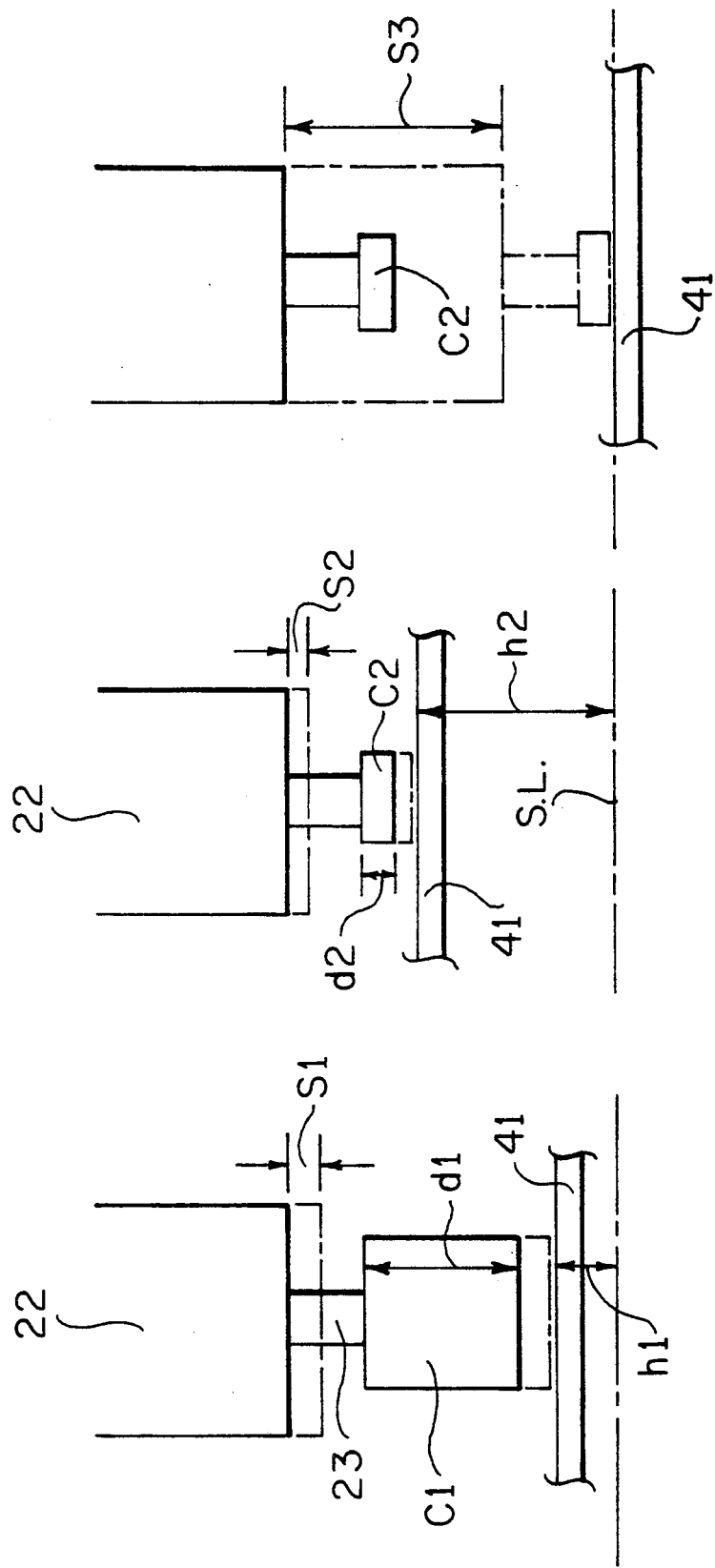

METHOD AND APPARATUS FOR MOUNTING ELECTRONIC PARTS

CROSS-REFERENCES TO RELATED APPLICATIONS

This is a continuation-in-part of U.S. patent application Ser. No. 723,915, filed on Jul. 1, 1991 now abandoned.

BACKGROUND OF THE INVENTION

1. Field of the Invention

This invention relates to an apparatus for mounting electronic parts on a printed circuit board. This invention also relates to a method of mounting electronic parts on a printed circuit board.

2. Description of the Prior Art

There are electronic parts mounting apparatuses of various types. Some of electronic parts mounting apparatuses include a suction station and a mounting station. An electronic component (an electronic part) is sucked to a mounting head in the suction station, and is carried to the mounting station in which the electronic component is mounted on a printed circuit board. Generally, it is necessary to accurately control the position, the angle, and the attitude of the electronic component on the mounting head before and during the placement of the electronic component on the printed circuit board.

Japanese published unexamined patent application 1-261898 (corresponding to U.S. Pat. No. 5,033,185) discloses an electronic parts mounting apparatus which includes a mechanism for adjusting the stroke of vertical movement of a mounting head in accordance with the thickness of an electronic component. When an electronic component is mounted on a printed circuit board, this mechanism serves to prevent the electronic component from being damaged.

SUMMARY OF THE INVENTION

It is an object of this invention to provide an improved electronic parts mounting apparatus.

It is another object of this invention to provide an improved method of mounting electronic parts.

A first aspect of this invention provides an electronic parts mounting apparatus comprising an index rotary member; means for rotating the index rotary member; a plurality of mounting heads provided on the index rotary member for sucking electronic components, and for mounting the electronic components on a printed circuit board; means for vertically moving the mounting heads through a stoke relative to the printed circuit board; means for adjusting the stroke of movement of the mounting heads; a horizontally-movable table; a vertically-movable table provided on the horizontally-movable table; clampers supported on the vertically-movable table for holding the printed circuit board therebetween; and means for vertically moving the vertically-movable table to adjust a height of the printed circuit board held between the clampers.

A second aspect of this invention provides an apparatus for mounting an electronic component on a printed circuit board which comprises means for clamping the printed circuit board; means for adjusting a height of the printed circuit board clamped by the clamping means; and means for mounting the electronic component on the printed circuit board clamped by the clamping means.

A third aspect of this invention provides a method of mounting an electronic component on a printed circuit board which comprises the steps of vertically moving the electronic component through a stroke toward the printed circuit board; adjusting the stroke of movement of the electric component in accordance with a thickness of the electronic component; and adjusting a height of the printed circuit board in accordance with the thickness of the electronic component.

BRIEF DESCRIPTION OF THE DRAWINGS

FIG. 4 includes front views of the mounting head and the nozzle in the electronic parts mounting apparatus of FIG. 1.

DESCRIPTION OF THE PREFERRED EMBODIMENT

Figure 1:
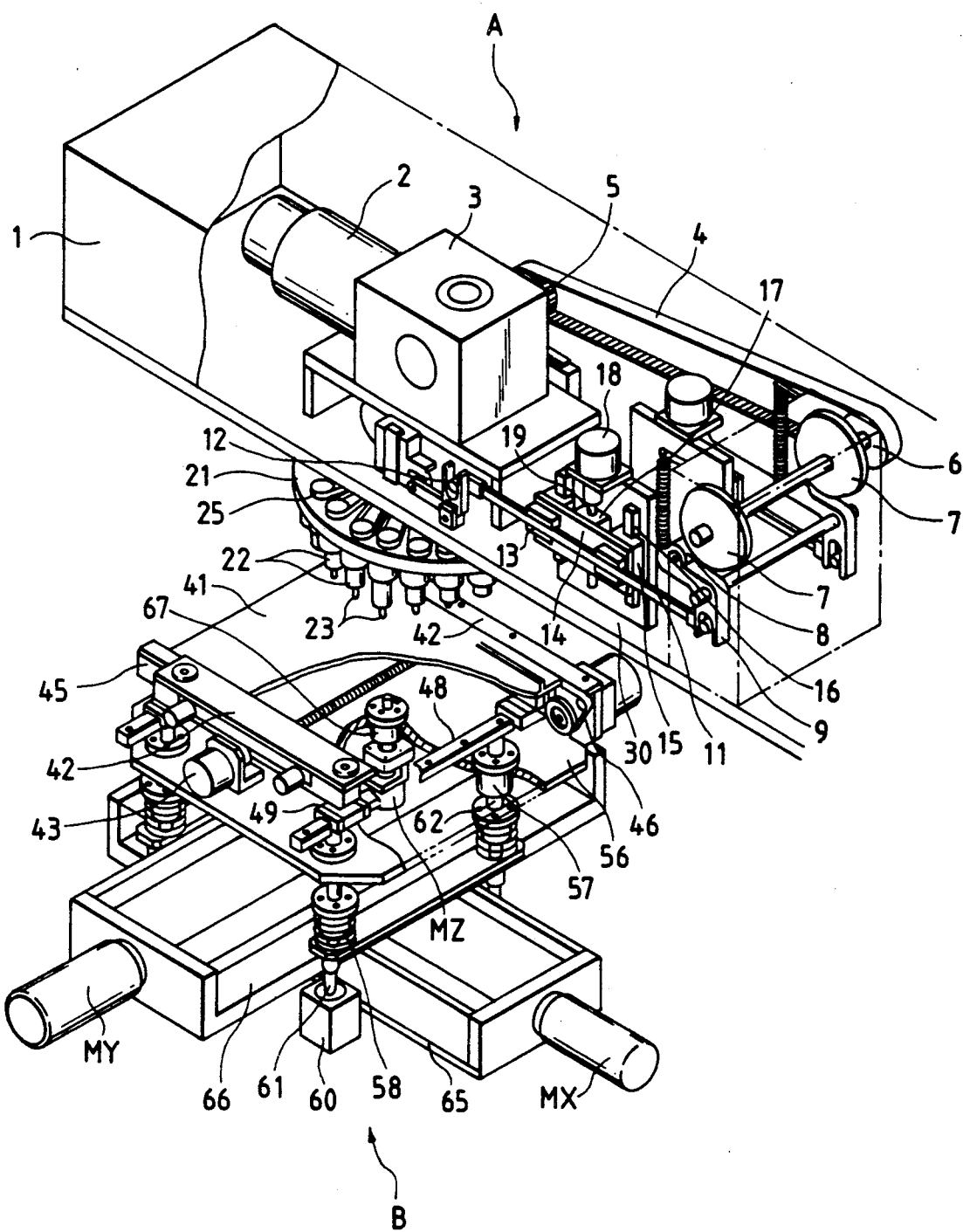
FIG. 1 is a perspectives view of an electronic parts mounting apparatus according to an embodiment of this invention.
Figure 2:
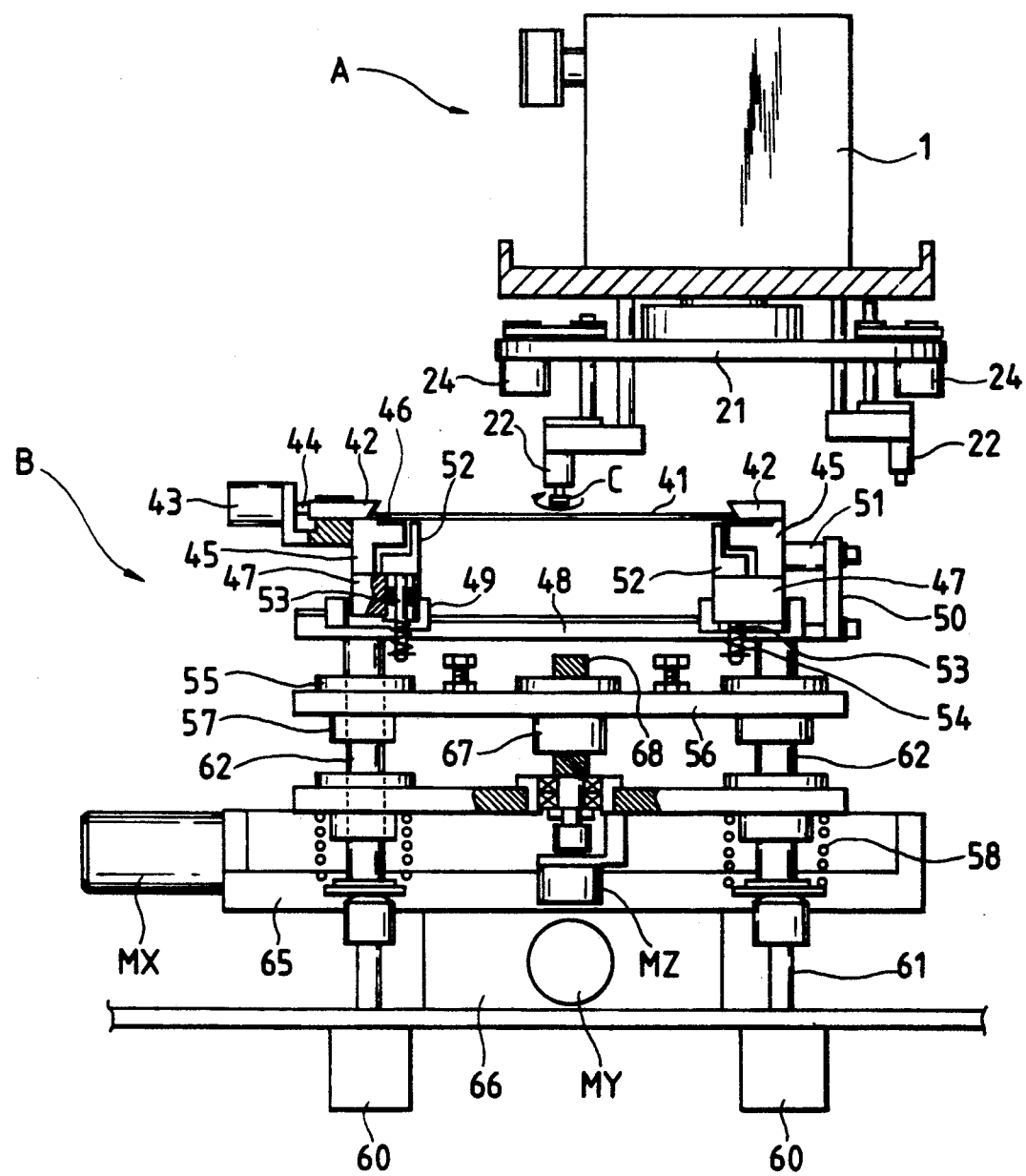
FIG. 2 is a front view of the electronic parts mounting apparatus of FIG. 1.
Figure 3:
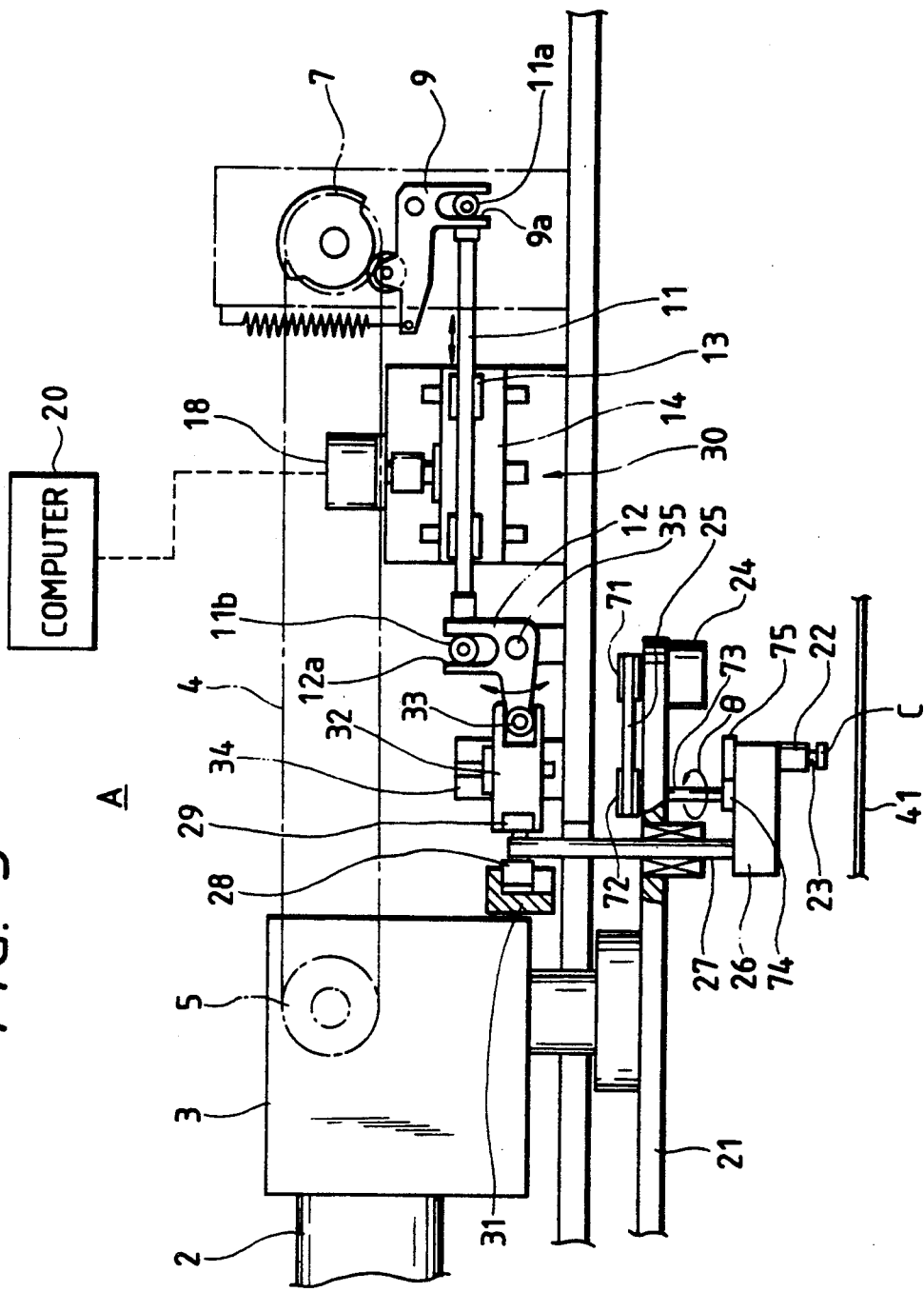
FIG. 3 is a side view of the electronic parts mounting apparatus of FIG. 1.

With reference to FIGS. 1-3, an electronic parts mounting apparatus includes a main body unit "A" and a board-locating unit "B". The main body unit "A" is shown, for example, U.S. Pat. No. 5,033,185 or Japanese published unexamined patent application 1-261898, the disclosure of which is hereby incorporated by reference.

A brief description will now be given of the main body unit "A". The main body unit "A" includes a body box 1 in which a motor 2 and a drive section 3 are disposed. The drive section 3 is activated by the motor 2. The drive section 3 includes a cam mechanism (not shown) which generates index rotation (intermittent rotation) from rotation of the output shaft of the motor 2. The index rotation (the intermittent rotation) generated by the drive section 3 is transmitted to cams 7 via a timing belt 4 and timing pulleys 5 and 6. Thus, the cams 7 rotate in response to the index rotation (the intermittent rotation) generated by the drive section 3. A cam follower 8 engaging one of the cams 7 is rotatably connected to a first end of a swingable lever 9. As the cam 7 rotates, the lever 9 swing.

As best shown in FIG. 3, the main body unit "A" includes a horizontal rod 11. Rollers 11a and 11b journaled on opposite ends of the horizontal rod 11 respectively. The roller 11a engages a second end of the lever 9. The roller 11b engages a first end of a lever 12 which can swing about a pin 35. The horizontal rod 11 is slidably supported by a guide plate 14. The horizontal rod 11 can slide on the guide plate 14 in a horizontal direction.

As best shown in FIG. 1, the guide plate 14 is slidably supported in vertical rails 16 via sliders 15. The guide plate 14 can moves along the vertical rails 16 in a vertical direction. A nut 17 attached to a back of the guide plate 14 engages to feed bolt 19. The feed bolt 19 is driven by a stepper motor 18. The stepper motor 18 is controlled by a computer 20 (see FIG. 3). As the stepper motor 18 drives the feed bolt 19, the nut 17 and the guide plate 14 are moved vertically so that the horizontal rod 11 is also moved vertically.

As best shown in FIG. 3, the lever 9 has a vertically-extending groove 9a in which the roller 11a fits. The lever 12 has a vertically-extending groove 12a in which the roller 11b fits. As the horizontal rod 11 moves vertically, the rollers 11a and 11b move vertically along the grooves 9a and 12a of the levers 9 and 12 respectively. As shown in FIGS. 1 and 2, an index rotary disc (an index turn table) 21 is located below the box 1. The index rotary disc 21 is provided with a plurality of mounting heads 22 spaced at equal angular intervals. The index rotary disc 21 is driven by the drive section 3, being subjected to index rotation. specifically, the index rotary disc 21 is intermittently rotated in a predetermined direction. Each of the mounting heads 22 has a nozzle 23 at its lower end for sucking an electronic component (an electronic part) "C".

As best shown in FIG. 3, a motor 24 supported on the index rotary disc 21 has an output shaft which is coupled to the associated mounting head 22 via pulleys 71 and 72, an endless belt 25, a rotatable shaft 73, and gears 74 and 75. Specifically, the pulley 71 is mounted on the output shaft of the motor 24. The pulley 72 is mounted on the shaft 73. The endless belt 25 connects the pulleys 71 and 72. The gear 74 is mounted on the shaft 73. The gear 74 meshes with the gear 75 connected to the mounting head 22. As the output shaft of the motor 24 rotates, the shaft 73 rotates in a direction denoted by "θ" of FIG. 3 so that the mounting head 22 also rotates about its vertical axis (longitudinal axis). The rotation of the mounting head 22 by the motor 24 is used in correcting an error of the angular position of the electronic component "C" held by the nozzle 23.

Each of the mounting heads 22 has a body 26 from which a lifting shaft 27 projects upward through the index rotary disk 21 and the lower walls of the body box 1. Rollers 28 and 29 are rotatably supported on an upper end of the lifting shaft 27. The roller 28 fits into a groove of a guide rail 31 disposed in the body box 1. As the index rotary head 21 rotates, the roller 28 moves along the guide rail 31. The roller 29 fits in a recess in a lifting member 32. The lifting member 32 has another recess in which a roller 33 fits. The roller 33 is journaled on a second end of the lever 12. The lifting member 32 is slidably supported on a guide 34. The lifting member 32 can move vertically along the guide 34.

As the cam 7 rotates, the lever 9 swings so that the horizontal rod 11 reciprocates horizontally. The reciprocation of the horizontal rod 11 causes the lever 12 to swing clockwise and counterclockwise about the pin 35. As the lever 12 swings clockwise and counterclockwise, the lifting member 32 and the lifting shaft 27 move up and down so that the mounting head 22 and the nozzle 23 also move up and down. During this movement of the mounting head 22, the electronic component "C" is sucked by the nozzle 23 and is carried by the nozzle 23 before being mounted on a printed circuit board 41.

The stroke of the vertical movement of the mounting head 22 depends on the angular range through which the lever 12 swings. The angular range through which the lever 12 swings depends on the vertical position of the roller 11b relative to the groove 12a of the lever 12, that is, the vertical position of the horizontal rod 11. As described previously, the vertical position of the horizontal rod 11 can be varied by the stepper motor 18. Thus, the stroke of the vertical movement of the mounting head 22 can be varied by the stepper motor 18. Generally, the computer 20 controls the stepper motor 18 to adjust the stroke of the vertical movement of the mounting head 22 in accordance with the thickness of the electronic component "C".

The board-locating unit "B" will now be described. As shown in FIGS. 1 and 2, the board-locating unit "B" includes a pair of clampers 42 for holding the printed circuit board 41 therebetween. An actuator 43 such as a hydraulic cylinder, an air cylinder, or a solenoid actuator has an output rod 44 connected to the left-hand clamper 42. When the actuator 43 is activated, the output rod 44 of the actuator 43 moves horizontally the left-hand clamper 42 toward the right-hand clamper 42 so that the printed circuit board 41 can be firmly held between the clampers 42.

Blocks 45 located below the clampers 42 support the clampers 42 respectively. The blocks 45 also support a conveyor belt 46 which serves to carry the printed circuit board 41. The blocks 45 are mounted on support members 47 respectively. The left-hand support member 47 is slidably connected to horizontally-extending guide rails 48 by sliders 49. The right-hand support member 47 is fixed to the guide rails 48 by brackets 50 and screws 51. Thus, the right-hand clamper 42 is fixed to the guide rails 48. The left-hand support member 47 can move horizontally along the guide rails 48 so that the left-hand clamper 42 can move horizontally toward and away from the right-hand clamper 42. Thus, the distance between the clampers 42 can be adjusted in accordance with the width of the printed circuit board 41.

Movable pressing members 52 are located above the support members 47 respectively. Vertical rods 53 movably extend through the support members 47 respectively. The pressing members 52 are attached to the upper ends of the vertical rods 53 respectively. Springs 54 are provided between the vertical rods 53 and the support members 47 to urge the vertical rods 53 downward respectively. Plates 55 attached to a Z table 56 extends below the vertical rods 53 respectively.

Actuators 60 such as hydraulic cylinders, air cylinders, or solenoid actuators have vertically-extending output rods 61 which can bear vertical rods 62. The upper ends of the vertical rods 62 are connected to the guide rails 48. The vertical rods 62 slidably extends through guide rings 57 attached to the Z table 56. The vertical rods 62 can move vertically. Springs 58 urge the vertical rods 62 downward to provide cushioning effects.

A description will be given of the case where the output rods 61 of the actuators 60 move downward from their highest positions. As the output rods 61 of the actuators 60 move downward, the vertical rods 62, the guide rails 48, the support members 47, the blocks 45, and the vertical rods 53 also move downward. In addition, the clampers 42 and the printed circuit board 41 held between the clampers 42 also move downward. Then, the lower ends of the vertical rods 53 encounter the plates 55 on the Z table 56 respectively. When the lower ends of the vertical rods 53 encounter the plates 55, the vertical rods 53 and the pressing members 52 stop to move but the printed circuit board 41 continues to move downward. After the lower ends of the vertical rods 53 encounter the plates 55, the pressing members 52 remain stationary but the printed circuit board 41 moves downward in accordance with the downward movement of the output rods 61 of the actuators 60. At the same time, the springs 54 are compressed. Thus, the upper ends of the pressing members 52 encounter the printed circuit board 41. Then, steps of the blocks 45 meet shoulders of the pressing members 52 so that the blocks 45 and the clampers 42 stop to move. The printed circuit board 41 also stops to move. Under these conditions, the clampers 42 are rigidly supported on the Z table 56 via the blocks 45, the pressing members 52, the vertical rods 53, and the plates 55. In addition, the printed circuit board 41 are firmly held by the clampers 42 and the pressing members 52. Specifically, the pressing members 52 abut the printed circuit board 41 and press the printed circuit board 41 upward, correcting a flexure of the printed circuit board 41. The correction of the flexure of the printed circuit board 41 ensures that the electronic component "C" can be accurately and reliably mounted on the printed circuit board 41.

An X table 65 is driven by a motor MX. A Y table 66 is driven by a motor MY. The X table 65 is slidably placed on the Y table 66. The previously-mentioned board-holding mechanism including the clampers 42 is placed on the X table 65, and is connected to the X table 65 via the members including the vertical rods 62. As the motor MX drives the X table 64, the printed circuit board 41 held between the clampers 42 move in a first predetermined horizontal direction. As the motor MY drives the Y table 66, the printed circuit board 41 held between the clampers 42 move in a second predetermined horizontal direction perpendicular to the first predetermined horizontal direction. Generally, the motors MX and MY are controlled by the computer 20 (see FIG. 3).

The Z table 56 is vertically driven by a motor MZ. A nut 67 attached to the Z table 56 engages a vertical feed screw 68. The vertical feed screw 68 is coupled to the output shaft of the motor MZ. When the output shaft of the motor MZ rotates, the vertical feed screw 68 also rotates so that the nut 67 and the Z table 56 move vertically. Under the conditions where the clampers 42 are rigidly supported on the Z table 56 as described previously, as the motor MZ drives the Z table 56, the printed circuit board 41 moves vertically. Generally, the computer 20 (see FIG. 3) controls the motor MZ to adjust the height (the vertical position) of the Z table 56 and thus the height (the vertical position) of the printed circuit board 41 in accordance with the thickness of the electronic component "C".

The electronic parts mounting apparatus of FIGS. 1-3 operates as follows. While the index rotary disc 21 is intermittently rotating, an electronic component "C" is sucked to a mounting head 22 and is carried to a position above the printed circuit board 41. Then, the mounting head 22 moves downward and mounts the electronic component "C" on the printed circuit board 41.

In the case of an electronic component C1 having a large thickness d1 as shown in the section (a) of FIG. 4, the printed circuit board 41 is previously located to a position upwardly spaced from a reference plane S.L. by a small distance h1. The pre-location of the printed circuit board 41 is executed by activating the motor MZ to drive the Z table 56. The distance h1 is chosen in accordance with the thickness d1 of the electronic component C1. In this case, the stroke of the vertical movement of the mounting head 22 is set to a value S1 chosen in accordance with the thickness d1 of the electronic component C1.

In the case of an electronic component C2 having a small thickness d2 as shown in the section (b) of FIG. 4, the printed circuit board 41 is previously located to a position upwardly spaced from the reference plane S.L. by a large distance h2. The pre-location of the printed circuit board 41 is executed by activating the motor MZ to drive the Z table 56. The distance h2 is chosen in accordance with the thickness d2 of the electronic component C2. In this case, the stroke of the vertical movement of the mounting head 22 is set to a value S2 chosen in accordance with the thickness d2 of the electronic component C2.

As understood from the previous description, the height (the vertical position) of the printed circuit board 41 is pre-adjusted in accordance with the thickness of an electronic component "C" so that the stroke of the vertical movement of the mounting head 22 can be small. The small stroke of the vertical movement of the mounting head 22 enables the electronic component "C" to be quickly mounted on the printed circuit board 41.

In the case where the printed circuit board 41 is pre-located at the reference plane S.L. as shown in the section (c) of FIG. 4, the stroke of the vertical movement of the mounting head 22 is set to a large value S3 for an electronic component C2 of a small thickness d2.

Figure 5B:
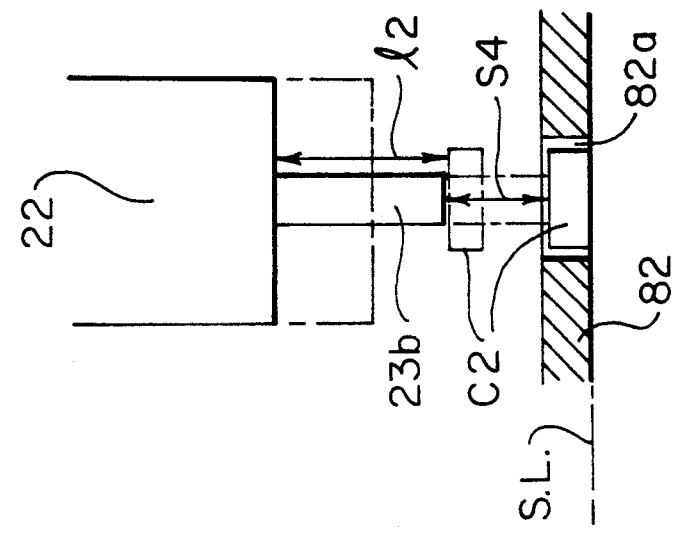
FIG. 5 includes sectional views of the mounting head, the nozzle, and an electronic component in the electronic parts mounting apparatus of FIG. 1.
Figure 5A:
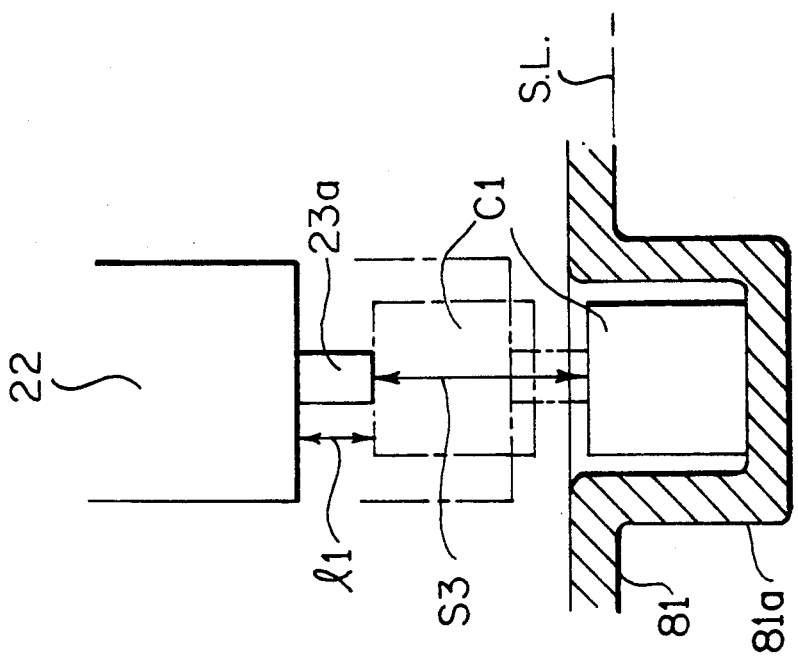

At the back side of the body box 1 of the main body unit "A", the mounting heads 22 take up electronic components "C" as follows. As shown in the sections (a) and (b) of FIG. 5, electronic components C1 and C2 are accommodated in pockets 81a and 82a of tapes 81 and 82 respectively. In the case of an electronic component C1 having a large thickness as shown in the section (a) of FIG. 5, the nozzle 23a is previously projected from the body of the mounting head 22 by a small distance l1. In this case, the stroke of the vertical movement of the nozzle 23a to take up the electronic component C1 is set to a large value S3 chosen in accordance with the depth of the pocket 81a of the tape 81. In this case of an electronic component C2 having a small thickness as shown in the section (b) of FIG. 5, the nozzle 23b is previously projected from the body of the mounting head 22 by a large distance l2. In this case, the stroke of the vertical movement of the nozzle 23b to take up the electronic component C2 is set to a small value S4 chosen in accordance with the depth of the pocket 82a of the tape 82.

What is claimed is:

1. A method of mounting an electronic component on a printed circuit board, comprising the steps of:
   vertically moving the electric component through a stroke toward the printed circuit board;
   adjusting the stroke of movement of the electric component in accordance with a thickness of the electronic component; and
   adjusting a height of the printed circuit board in accordance with the thickness of the electronic component.

2. An electronic parts mounting apparatus comprising:
   an index rotary member;
   means for rotating the index rotary member;
   a plurality of mounting heads provided on the index rotary member for sucking electronic components, and for mounting the electronic components on a printed circuit board;
   means for vertically moving the mounting heads through a stoke relative to the printed circuit board;
   means for adjusting the stroke of movement of the mounting heads;

a horizontally-movable table;
a vertically-movable table provided on the horizontally-movable table;
clampers supported on the vertically-movable table for holding the printed circuit board therebetween; and
means for vertically moving the vertically-movable table to adjust a height of the printed circuit board held between the clampers.

3. The electronic parts mounting apparatus of claim 1, further comprising means for correcting a flexure of the printed circuit board held between the clampers.

* * * * *